(12) United States Patent
Hong et al.

(10) Patent No.: US 12,520,431 B2
(45) Date of Patent: Jan. 6, 2026

(54) ELECTRONIC DEVICE COMPRISING SOLDER WALL

(71) Applicant: SAMSUNG ELECTRONICS CO., LTD., Suwon-si (KR)

(72) Inventors: Eun-seok Hong, Suwon-si (KR);
Jungje Bang, Suwon-si (KR);
Kyungho Lee, Suwon-si (KR);
Hyunsung Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 433 days.

(21) Appl. No.: 18/311,477

(22) Filed: May 3, 2023

(65) Prior Publication Data
US 2025/0227852 A1 Jul. 10, 2025

Related U.S. Application Data

(63) Continuation of application No. PCT/KR2021/013483, filed on Oct. 1, 2021.

(30) Foreign Application Priority Data

Nov. 6, 2020 (KR) .................. 10-2020-0147630

(51) Int. Cl.
*H05K 1/18* (2006.01)
*H05K 1/02* (2006.01)
*H05K 1/11* (2006.01)

(52) U.S. Cl.
CPC ............. *H05K 1/189* (2013.01); *H05K 1/028* (2013.01); *H05K 1/111* (2013.01); *H05K 1/181* (2013.01);
(Continued)

(58) Field of Classification Search
CPC ........ H05K 1/028; H05K 1/111; H05K 1/189; H05K 2201/0305; H05K 2201/2009
See application file for complete search history.

(56) References Cited

U.S. PATENT DOCUMENTS

| 7,148,560 B2 | 12/2006 | Lee et al. |
| 7,821,131 B2 | 10/2010 | Johnson |

(Continued)

FOREIGN PATENT DOCUMENTS

| JP | 2006140327 A | 6/2006 |
| KR | 100825159 B1 | 4/2008 |

(Continued)

OTHER PUBLICATIONS

International Search Report for PCT/KR2021/013483, mailed Jan. 10, 2022, 3 pages.

(Continued)

*Primary Examiner* — Nathan Milakovich
(74) *Attorney, Agent, or Firm* — Nixon & Vanderhye P.C.

(57) ABSTRACT

An electronic device may include: a flexible printed circuit board having a flexible region and a support region and configured to be deformable in the flexible region; an antenna module facing the support region of the flexible printed circuit board; a solder ball for connecting the antenna module to the flexible printed circuit board; an underfill resin filled between the flexible printed circuit board and the antenna module in a liquid state and then solidified; and a solder wall for connecting the antenna module to the flexible printed circuit board and placed between the solder ball and the flexible region to block the flow of the underfill from the support region toward the flexible region before the underfill resin is solidified, and the solder wall has a width equal to or greater than the width of the flexible region. Various other embodiments are possible.

18 Claims, 13 Drawing Sheets

(52) U.S. Cl.
CPC ............ *H05K 2201/0305* (2013.01); *H05K 2201/10098* (2013.01); *H05K 2201/2009* (2013.01)

(56) References Cited

U.S. PATENT DOCUMENTS

| | | | |
|---|---|---|---|
| 7,919,356 B2 | 4/2011 | Farooq et al. | |
| 8,350,383 B2 | 1/2013 | Daubenspeck et al. | |
| 2008/0315410 A1* | 12/2008 | Johnson | H01L 24/81 257/737 |
| 2019/0027801 A1 | 1/2019 | Oguri et al. | |
| 2023/0345623 A1* | 10/2023 | van Gemert | H01P 5/024 |

FOREIGN PATENT DOCUMENTS

| | | | |
|---|---|---|---|
| KR | 20120126368 A | 11/2012 | |
| KR | 101906269 B1 | 10/2018 | |
| WO | 2010000806 A1 | 1/2010 | |

OTHER PUBLICATIONS

Written Opinion of the ISA for PCT/KR2021/013483, mailed Jan. 10, 2022, 4 pages.

\* cited by examiner

ELECTRONIC DEVICE COMPRISING SOLDER WALL

CROSS-REFERENCE TO RELATED APPLICATIONS

This application is a continuation application of International Application No. PCT/KR2021/013483 designating the United States, filed on Oct. 1, 2021, in the Korean Intellectual Property Receiving Office and claiming priority to Korean Patent Application No. 10-2020-0147630, filed on Nov. 6, 2020, in the Korean Intellectual Property Office, the disclosures of all of which are hereby incorporated by reference herein in their entireties.

BACKGROUND

Field

Certain example embodiments relate to an electronic device including a solder wall.

Description of Related Art

Various types of electronic devices, such as smart phones, tablet personal computers (PCs), or personal digital assistants (PDAs), are provided with the development of digital technology. To improve portability and user accessibility, types of electronic devices that users may wear are also being developed. With the development of wireless communication technology, electronic devices (e.g., electronic devices for communications) are commonly used in daily life, leading to an exponential increase in the use of content. An electronic device may include a printed circuit board (PCB) including an antenna.

An antenna module that uses an ultra-high frequency band may include a PCB, wherein at least one conductive member (e.g., a conductive pattern or conductive patch) used as an antenna radiator may be disposed on one surface of the PCB, and a wireless communication circuit (e.g., a radio frequency (RF) module) electrically connected to the conductive member may be mounted on the other surface of the PCB. For example, the electronic device may include an electrical connection member for transmitting a high-frequency RF signal from the PCB of the antenna module to a main PCB of the electronic device. Recently, a flexible printed circuit board (FPCB) may be used as the electrical connection member, and a solder joint structure that is relatively excellent in connection reliability and relatively inexpensive may be used as an electrical connection structure of the PCB of the antenna module and the FPCB.

SUMMARY

A millimeter wave (mmWave) module may be produced through surface mounting of each of an antenna module and a communication module on a flexible printed circuit board (FPCB). After the surface mounting of the antenna module or the communication module, an underfill resin may be used to increase the bonding strength of a joint portion. A space between the antenna module and the FPCB or a space between the communication module and the FPCB may be filled with the underfill resin. A dam may be used to set a spread range of the underfill resin.

When the mmWave module is provided inside a housing, a portion of the FPCB of the mmWave module may sharply bend about 90 degrees. Here, the portion of the FPCB that bends will be referred to as a "bending part". In the state of the surface mounting of the antenna module and the communication module on the FPCB, when the underfill resin invades the bending part while being applied to the FPCB, the underfill resin may increase the stress applied to the bending part and cause cracks in the bending part while the bending part bends.

There is a desire for a technique for preventing or reducing the underfill resin from invading the bending part while the underfill resin is being applied.

According to various example embodiments, an electronic device may include: an FPCB having a flexible area and a support area and configured to be deformable in the flexible area: an antenna module facing the support area of the FPCB: a solder ball for connecting the FPCB and the antenna module: an underfill resin filled between the FPCB and the antenna module in a liquid state and then solidified; and a solder wall for connecting the FPCB and the antenna module and positioned between the solder ball and the flexible area to block a flow of the underfill resin from the support area toward the flexible area before the underfill resin is solidified, the solder wall having a width equal to or greater than a width of the flexible area.

According to various example embodiments, an electronic device may include: an FPCB having a flexible area and a support area and configured to be deformable in the flexible area: an antenna module facing the support area of the FPCB; a solder ball 330 for connecting the FPCB and the antenna module: an underfill resin filled between the FPCB and the antenna module; and a solder wall for connecting the FPCB and the antenna module and positioned between the solder ball and the flexible area, wherein both ends of the solder wall may be provided on an outer side than both ends of the flexible area, based on a width direction of the flexible area.

According to various example embodiments, an electronic device may include: a housing: an FPCB including a support area provided in a flat state, and a flexible area connected to the support area and provided in a bending state, the FPCB positioned in the housing: an antenna module facing the support area of the FPCB: a solder ball for connecting the FPCB and the antenna module; an underfill resin filled between the FPCB and the antenna module in a liquid state and then solidified; and a solder wall for connecting the FPCB and the antenna module and configured to block a flow of the underfill resin from the support area toward the flexible area before the underfill resin is solidified, the solder wall having a width equal to or greater than a width of the flexible area of the FPCB.

Effects

According to various example embodiments, a solder wall may reduce or block an invasion of an underfill resin in a liquid state into a flexible area of a flexible printed circuit board (FPCB) while the underfill resin is applied to the FPCB.

According to various example embodiments, a spread range of an underfill resin may be set using a solder used for surface mounting of an antenna module or a communication module on an FPCB without a separate additional component.

BRIEF DESCRIPTION OF DRAWINGS

The above and other aspects, features, and advantages of certain embodiments of the disclosure will be more apparent from the following detailed description, taken in conjunction with the accompanying drawings, in which.

DETAILED DESCRIPTION

Figure 1:
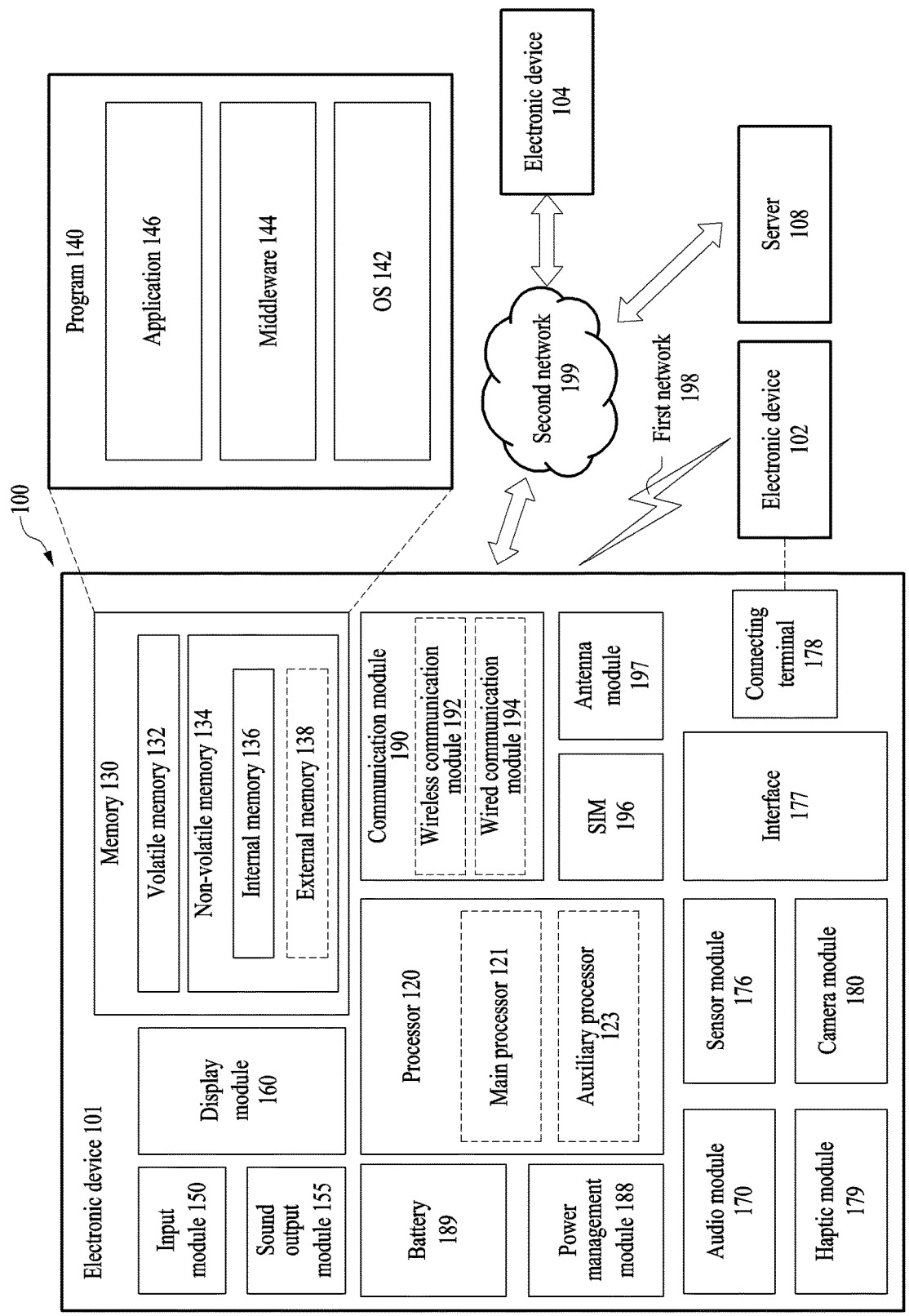
FIG. 1 is a block diagram illustrating an electronic device in a network environment according to various example embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a portion of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a portion of the antenna module 197.

According to an example embodiment, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request, and may transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The wireless communication module 192 may include an MST communication module or an NFC communication module, and the power management module 188 may include a wireless charging module. In this case, the antenna module 197 may include a plurality of antennas including an MST antenna connected to the MST communication module, an NFC antenna connected to the NFC communication module, and a wireless charging antenna connected to the wireless charging module.

The electronic device according to an example embodiment may be one of various types of electronic devices. The electronic device may include, for example, a portable communication device (e.g., a smart phone), a computer device, a portable multimedia device, a portable medical device, a camera, a wearable device, or a home appliance device. According to an example embodiment of the disclosure, the electronic device is not limited to those described above.

It should be appreciated that various embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "at least one of A, B, or C", each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via at least a third element(s).

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an example embodiment, the module may be implemented in a form of an application-specific integrated circuit (ASIC). Thus, each "module" herein may comprise circuitry.

Various embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to an example embodiment, each component (e.g., a module or a program) of the above-described components may include a single entity or multiple entities, and some of the multiple entities may be separately disposed in different components. According to an example embodiment, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

Figure 2:
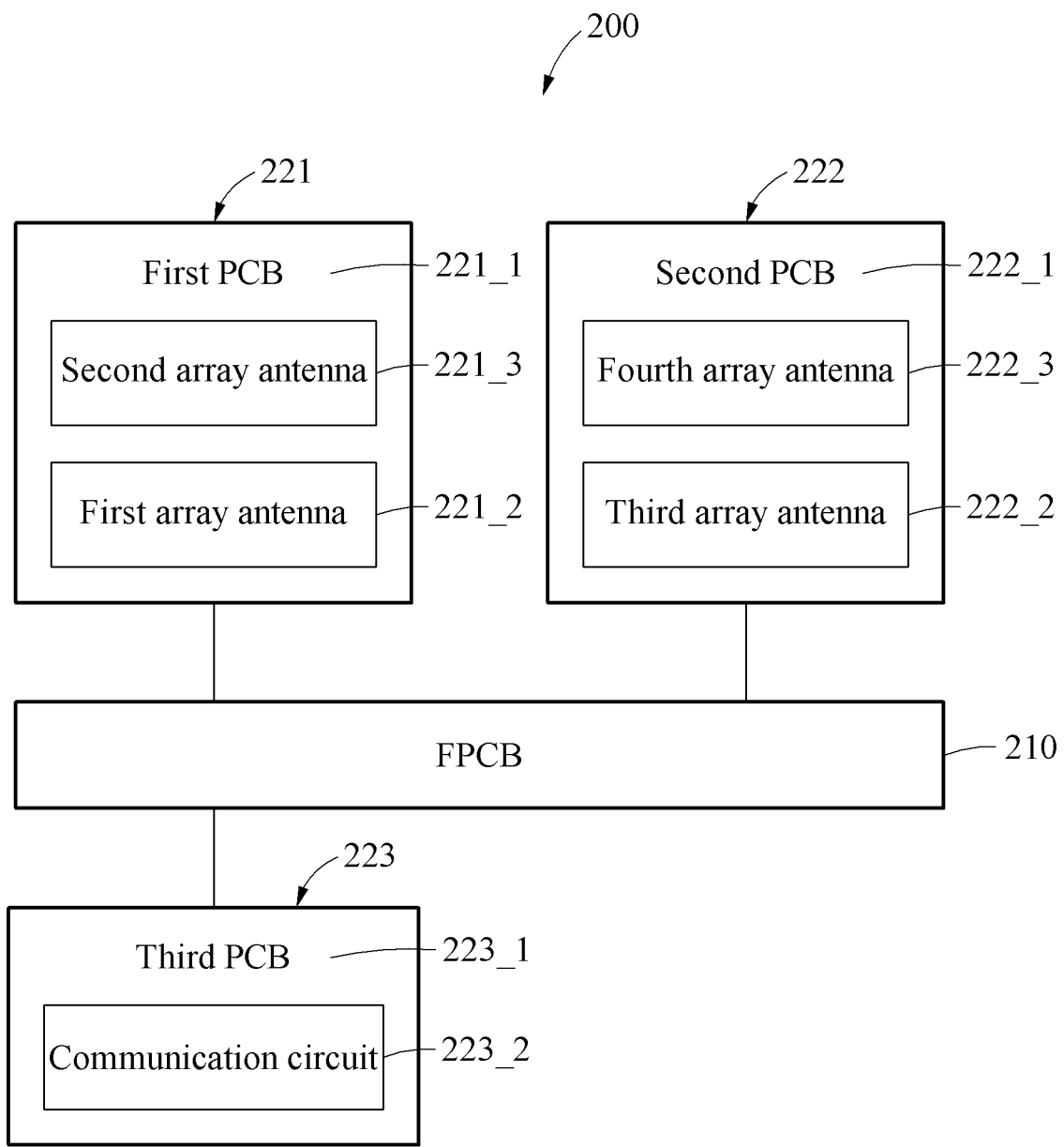
FIG. 2 is a block diagram schematically illustrating an electronic device according to an example embodiment.

FIG. 2 is a block diagram schematically illustrating an electronic device according to an embodiment.

Referring to FIG. 2, in an embodiment, an electronic device 200 (e.g., the electronic device 101 of FIG. 1) may include a flexible printed circuit board 210 (e.g., FPCB), a first antenna module 221 (e.g., the antenna module 197 of FIG. 1), a second antenna module 222 (e.g., the antenna module 197 of FIG. 1), and a communication module 223.

In FIG. 2, the first antenna module 221, the second antenna module 222, and the communication module 223 are shown as being connected to the FPCB 210 by lines, which, however, schematically illustrates the surface mounting state.

According to various embodiments, the FPCB 210 may include a flexible copper clad laminate (FCCL). For example, the FCCL may be formed by combining a flexible polyester film or polyimide film and copper foil with an adhesive (e.g., an acrylic adhesive).

According to various embodiments, the first antenna module 221 may include a first PCB 221_1 and array antennas 221_2 and 221_3. Although two array antennas are shown in the drawing, the number of array antennas may be "1" or "3" or more and is not limited thereto.

According to various embodiments, the first PCB 221_1 may face the FPCB 210. The first PCB 221_1 may be connected to the FPCB 210 by a solder ball, a solder wall, and an underfill resin. The first PCB 221_1 may be formed using a copper clad laminate (CCL) (or an original plate). The CCL may be, for example, a composite CCL made by combining two or more types of reinforcing substrates. According to an example embodiment, the composite CCL may include a composite type of laminate material bonded with a flame retardant epoxy resin (CEM)-1 or CEM-3 defined by the National Electrical Manufacturers Association (NEMA). CEM-1 may include a center substrate (or a core) formed of paper impregnated with an epoxy resin, an outer substrate formed of woven glass fibers impregnated with an epoxy resin, and copper foil bonded to the outer substrate. CEM-3 may include a center substrate formed of non-woven glass fibers (e.g., non-woven glass fabric) impregnated with an epoxy resin, an outer substrate formed of woven glass fibers impregnated with an epoxy resin, and copper foil bonded to the outer substrate. Glass fibers or paper may improve machinability, heat resistance, or dimensional stability. According to some embodiments, the CCL may be FR-6 including a center substrate formed of non-woven glass fibers (e.g., non-woven glass fabric) impregnated with a polyester resin, an outer substrate formed of glass fibers impregnated with a resin, and copper foil bonded to the outer substrate.

According to various embodiments, CEM-3 may be designed to replace FR-4 or FR-5. CEM-3 has relatively fewer glass fibers compared to FR-4 or FR-5 and may thus have relatively low mechanical strength. When CEM-3 is designed to replace FR-4 or FR-5, this mechanical strength may be considered. According to various embodiments, when punching is required, CEM-3, which is more advantageous for punching, may be applied when manufacturing PCBs, instead of FR-4.

According to various embodiments, the first PCB 221_1 may be formed of various materials, such as paper phenolic (FR-2, FR-3, etc.), epoxy (FR-4, FR-5, G-2, G-11, etc.), polyamide, B. T, metal, Teflon, ceramic, and halogen free.

According to various embodiments, the CCL may be a high-frequency CCL made of materials to cope with high-speed signal transmission. For example, the propagation speed of signals in a PCB is inversely proportional to the permittivity of materials, and thus, using materials having low permittivity may increase the propagation speed of signals.

According to some embodiments, the CCL may be formed by disposing a film prepreg of an insulating material on a plate of metal such as aluminum or iron, and then bonding copper foil to the film prepreg.

According to various embodiments, the array antennas 221_2 and 221_3 may include a first array antenna 221_2 and a second array antenna 221_3. Each of the first array antenna 221_2 and the second array antenna 221_3 may include a plurality of antennas. The antennas may include, for example, one or more of patch antennas, loop antennas, and dipole antennas. For example, at least a portion of the plurality of antennas included in the first array antenna 221_2 may be patch antennas for forming beams toward a rear surface of the electronic device 200. As another example, at least a portion of the plurality of antennas included in the second array antenna 221_3 may be dipole antennas or loop antennas for forming beams toward a side surface of the electronic device 200.

According to various embodiments, the second antenna module 222 may include a second PCB 222_1 that faces the FPCB 210 and is connected to the FPCB 210, and array antennas 222_2 and 222_3. The array antennas 222_2 and 222_3 may include a third array antenna 222_2 and a fourth array antenna 222_3. The description of the first array antenna 221_2 and the second array antenna 221_3 will substitute for the description of the third array antenna 222_2 and the fourth array antenna 222_3.

Herein, the first PCB and the second PCB may also be referred to as the "PCB".

According to various embodiments, the communication module 223 may include a third PCB 223_1 that faces the FPCB 210 on the opposite side of the first antenna module 221 and is connected to the FPCB 210, and a communication circuit 223_2. Each of the first antenna module 221 and the second antenna module 222 may be electrically connected to the communication module 223 by transmission lines provided in the FPCB 210.

According to various embodiments, the communication circuit 223_2 may support at least a portion of a band from about 20 GHz to about 100 GHz (e.g., from about 24 GHz to about 30 GHz or from about 37 GHz to about 40 GHz). The communication circuit 223_2 may upconvert or downconvert the frequency. For example, the communication circuit 223_2 may upconvert an intermediate frequency (IF) signal received from a communication module (e.g., the communication module 190 of FIG. 1) through a conductive line to an RF signal. As another example, the communication circuit 223_2 may downconvert an RF signal (e.g., a mmWave signal) received through the array antennas 221_2, 221_3, 222_2, and 222_3 to an IF signal, and transmit the IF signal to the communication module (e.g., the communication module 190 of FIG. 1) using the conductive line.

Figure 3:
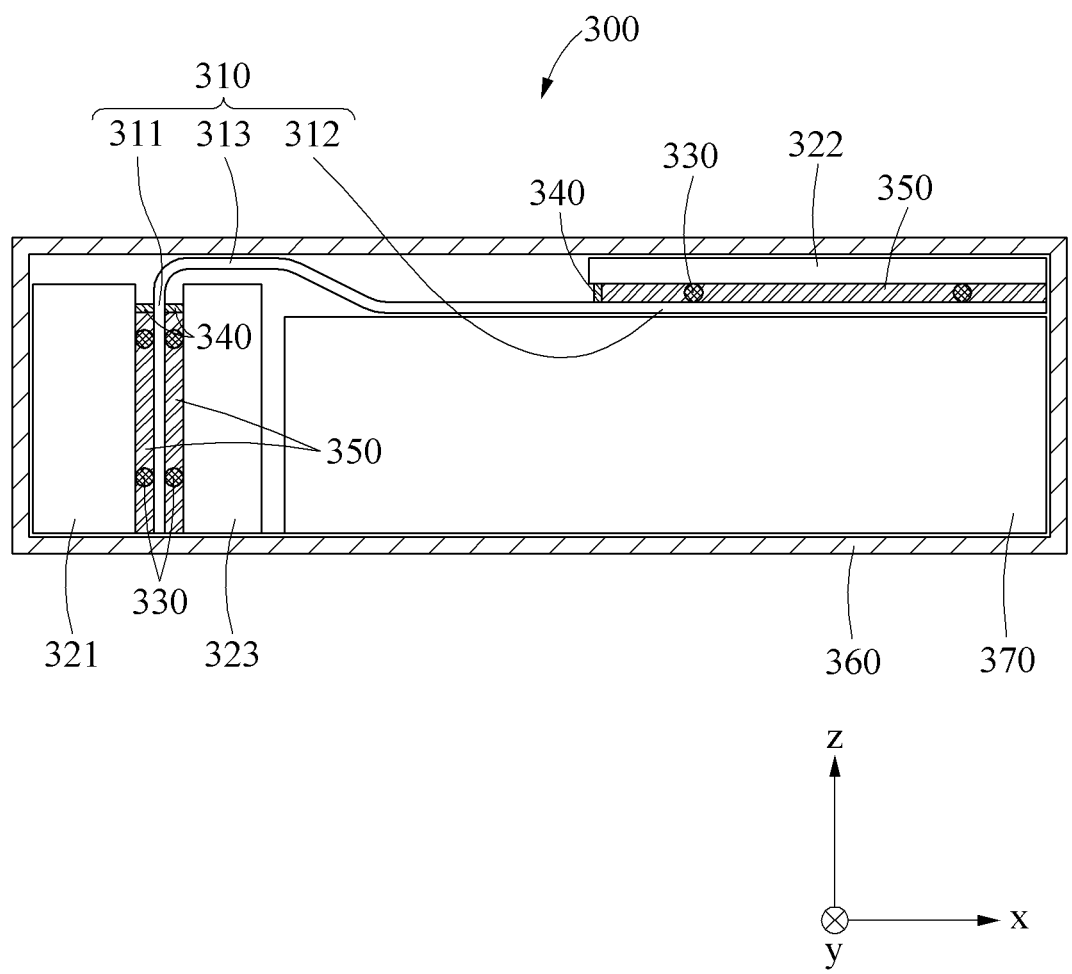
FIG. 3 is a cross-sectional view schematically illustrating an electronic device according to an example embodiment.

FIG. 3 is a cross-sectional view schematically illustrating an electronic device according to an embodiment.

Referring to FIG. 3, in an embodiment, an electronic device 300 (e.g., the electronic device 101 of FIG. 1) may include an FPCB 310, a first antenna module 321, a second communication device 322, a communication module 323, a solder ball 330, a solder wall 340, an underfill resin 350, a housing 360, and embedded components 370 (e.g., at least one or more of the processor 120, the memory 130, the input module 150, the sound output module 155, the display module 160, the audio module 170, the sensor module 176, the interface 177, the connecting terminal 178, the haptic module 179, the camera module 180, the power management module 188, the battery 189, the communication module 190, and the SIM 196 of FIG. 1).

According to various embodiments, the housing 360 may have a hollow space therein. The housing 360 may accommodate the FPCB 310, the first antenna module 321, the second antenna module 322, the communication module 323, the solder ball 330, the solder wall 340, the underfill resin 350, and the embedded components 370 in the hollow space. At least one surface of the housing 360 may be opened, and some components (e.g., the display module 160, the interface 177, or the camera module 180 of FIG. 1) may be visually exposed to the outside through the opening.

According to various embodiments, the FPCB 310 may be provided in a state of a portion bending in the housing 360 to vertically mount or horizontally mount the antenna modules 321 and 322. For example, the first antenna module 321 may be in surface mounting on the FPCB 310 in a horizontal direction (the x-axis direction), and the second antenna module 322 may be in surface mounting on the FPCB 310 in a vertical direction (the z-axis direction). The FPCB 310 may include a first support area 311 provided in a vertical state within the housing 360, a second support area 312 provided in a horizontal state within the housing 360, and a flexible area 313 connecting, directly or indirectly, the first support area 311 and the second support area 312.

According to various embodiments, the first support area 311 may be an area supporting the first antenna module 321. The first support area 311 may overlap the first antenna module 321 of the FPCB 310 based on a direction from the first antenna module 321 toward the FPCB 310. In other words, the first support area 311 may be covered by the first antenna module 321 of the FPCB 310. The second support area 312 may be an area supporting the second antenna module 322. The second support area 312 may overlap the second antenna module 322 of the FPCB 310 based on a direction from the second antenna module 322 toward the FPCB 310. In other words, the second support area 312 may be covered by the second antenna module 322 of the FPCB 310. The flexible area 313 refers to a region between the first support area 311 and the second support area 312. The flexible area 313 may include both a bending portion and a flat portion.

According to various embodiments, the first support area 311 may support the first antenna module 321 and the communication module 323. The first antenna module 321 may face a first surface of the first support area 311 and be connected to the first surface, and the communication module 323 may face a second surface, which is the opposite surface of the first surface of the first support area 311, and be connected to the second surface. The first antenna module 321 and the communication module 323 may be provided on opposite sides based on the first support area 311. The first support area 311 may support the first antenna module 321 such that the first antenna module 321 may be vertically mounted in the housing 360.

According to various embodiments, the second support area 312 may support the second antenna module 322. The second support area 312 may be provided (to be spaced apart) on the opposite side of the first support area 311 based on the flexible area 313. The second support area 312 may support the second antenna module 322 such that the second antenna module 322 may be horizontally mounted in the housing 360.

According to various embodiments, the first support area 311 and the second support area 312 may be provided in intersecting directions within the housing 360. For example, an imaginary line perpendicularly passing through the first support area 311 may intersect with an imaginary line perpendicularly passing through the second support area 312. The first support area 311 may face a first surface of inner surfaces of the housing 360, and the second support area 312 may face a second surface, adjacent to the first surface, of the inner surface of the housing 360. For example, the first surface and the second surface of the housing 360 may be substantially perpendicular to each other.

According to various embodiments, the flexible area 312 may include a bending portion that connects the first support area 311 provided in a vertical state within the housing 360 and the second support area 312 provided in a horizontal state within the housing 360. For example, the flexible area 312 may include a portion that bends at an angle between about 45 degrees and about 180 degrees (e.g., a portion that bends at about 90 degrees in FIG. 3).

According to various embodiments, the solder ball 330 may connect each of the first antenna module 321, the second antenna module 322, and the communication module 323 to the FPCB 310. For example, the solder ball 330 provided between the FPCB 310 and the first antenna module 321 may undergo reflow treatment, such that a surface that touches the FPCB 310 (a surface that faces the +x direction) may be fixed to the FPCB 310, and a surface that touches the first antenna module 321 (a surface that faces the −x direction) may be fixed to the first antenna module 321. The solder ball 330 may be fixed to a pad provided in the FPCB 310 and a pad provided in the first antenna module 321.

For example, the solder ball 330 provided between the FPCB 310 and the second antenna module 322 may undergo reflow treatment, such that a lower surface thereof may be fixed to the PCB 310, and an upper surface thereof may be fixed to the second antenna module 322. The solder ball 330 provided between the FPCB 310 and the communication module 323 may undergo reflow treatment, such that a lower surface thereof may be fixed to the PCB 310, and an upper surface thereof may be fixed to the communication module 323.

According to various embodiments, the solder ball 330 may physically connect at least one or more of the first antenna module 321, the second antenna module 322, and the communication module 323 to the FPCB 310, and may also electrically connect the same to the FPCB 310. For example, a plurality of solder balls 330 may be provided between the FPCB 310 and the first antenna module 321. The number of solder balls 330 provided between the FPCB 310 and the first antenna module 321 may be determined based on the number of signal lines that are necessary. For example, the solder ball 330 may assist an array antenna provided in the first antenna module 321 to be electrically connected to the communication module 323, and assist an array antenna provided in the second antenna module 322 to be electrically connected to the communication module 323.

According to various embodiments, the solder wall 340 may block the underfill resin 350 from reaching the flexible area 313 of the FPCB 310. For example, the solder wall 340 may be positioned between the solder ball 330 and the flexible area 313 to block a flow of the underfill resin 350 from the support area 311 or 312 toward the flexible area 313 before the underfill resin 350 is solidified, and set a boundary of the underfill resin 350 in a direction from the first support area 311 or the second support area 312 toward the flexible area 313. For example, while a space between the first antenna module 321 and the FPCB 310 is filled with the underfill resin 350, that is, the first support area 311 is filled with the underfill resin 350, the flow of the underfill resin 350 toward the flexible area 313 may be blocked by the solder wall 340. The solder wall 340 may block the underfill resin 350 from reaching the flexible area 313, thereby reducing or eliminating cracks caused by the underfill resin 350 in the flexible area 313.

For example, the solder wall 340 and the solder ball 330 may be formed of the same material. For example, the solder wall 340 and the solder ball 330 may include at least one or more of tin, lead, silver, copper, and zinc.

According to various embodiments, similar to the solder ball 330, the solder wall 340 may connect one or more of the first antenna module 321, the second antenna module 322, and the communication module 323 to the FPCB 310. For example, the solder wall 340 provided between the FPCB 310 and the first antenna module 321 may undergo reflow treatment, such that a lower surface thereof may be fixed to the PCB 310, and an upper surface thereof may be fixed to the first antenna module 321. The solder wall 340 may be fixed to a pad provided in the FPCB 310 and a pad provided in the first antenna module 321. The pad provided in the FPCB 310 to support the solder wall 340 may be connected to a ground plane (not shown) provided inside the FPCB 310. The ground plane may shield or reduce electromagnetic noise. The solder wall 340 may be provided to be spaced apart from the solder ball 330 to prevent or reduce the solder ball 330 from being connected to the ground plane.

For example, the solder wall 340 provided between the FPCB 310 and the second antenna module 322 may undergo reflow treatment, such that a lower surface thereof may be fixed to the PCB 310, and an upper surface thereof may be fixed to the second antenna module 322. The solder wall 340 provided between the FPCB 310 and the communication module 323 may undergo reflow treatment, such that a lower surface thereof may be fixed to the PCB 310, and an upper surface thereof may be fixed to the communication module 323.

According to various embodiments, the reflow treatment may be supplying a solder in advance in a land (e.g., a pad) of a substrate and melt the solder with an external heat source for connection, and may include a soldering process for soldering on the substrate. In some embodiments, the soldering process is not limited to reflow soldering, and various methods such as flow soldering other than reflow soldering may be used.

According to various embodiments, the space between the first antenna module 321, the second antenna module 322, or the communication module 323 and the FPCB 310 may be filled with the underfill resin 350. The space between the first antenna module 321, the second antenna module 322, or the communication module 323 and the FPCB 310 may be filled with the underfill resin 350 in a liquid state, and the underfill resin 350 may be solidified in a state of filling the space. When the underfill resin 350 is solidified, the first antenna module 321, the second antenna module 322, or the communication module 323 may be firmly fixed to the FPCB 310. The underfill resin 350 may be provided in the first support area 311 or the second support area 312, but may not be provided in the flexible area 313.

According to various embodiments, the first support area 311 or the second support area 312 may be fixed to the first antenna module 321 or the second antenna module 322 by the solder ball 330, the solder wall 340, and the underfill resin 350 and maintain the shape, and the flexible area 313 may be in a deformable state.

In FIG. 3, the first antenna module 321 and the communication module 323 are shown as being positioned in the x-axis direction based on the embedded components 370, and the second antenna module 322 is shown as being positioned in the y-axis direction based on the embedded components 370. However, embodiments are not limited thereto. For example, the first antenna module 321 and the communication module 323 may be positioned in the y-axis direction based on the embedded components 370, and the second antenna module 322 may be positioned in the z-axis direction based on the embedded components 370.

Figure 4A:
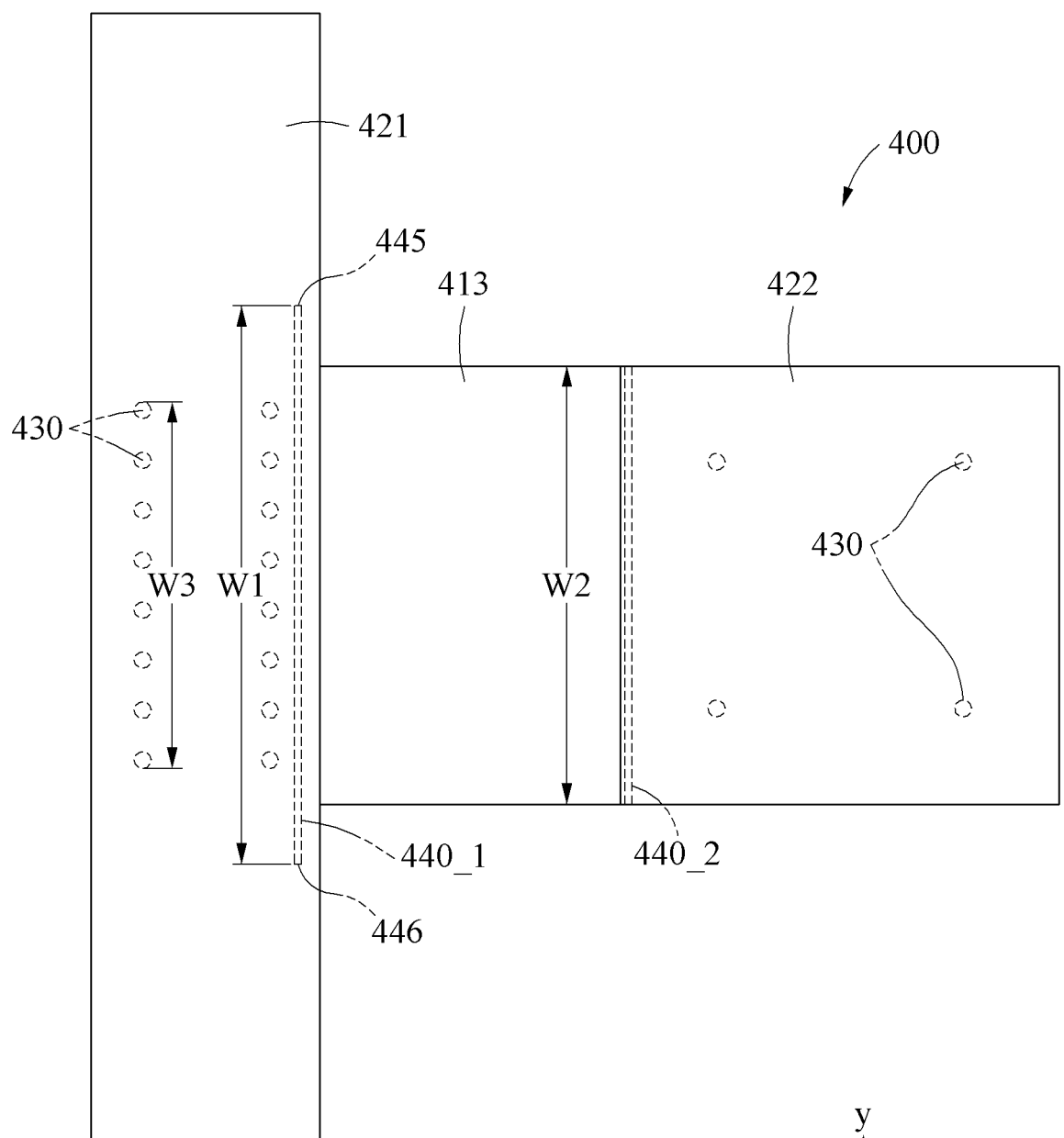
FIG. 4A is a plan view schematically illustrating an electronic device according to an example embodiment.
Figure 4B:
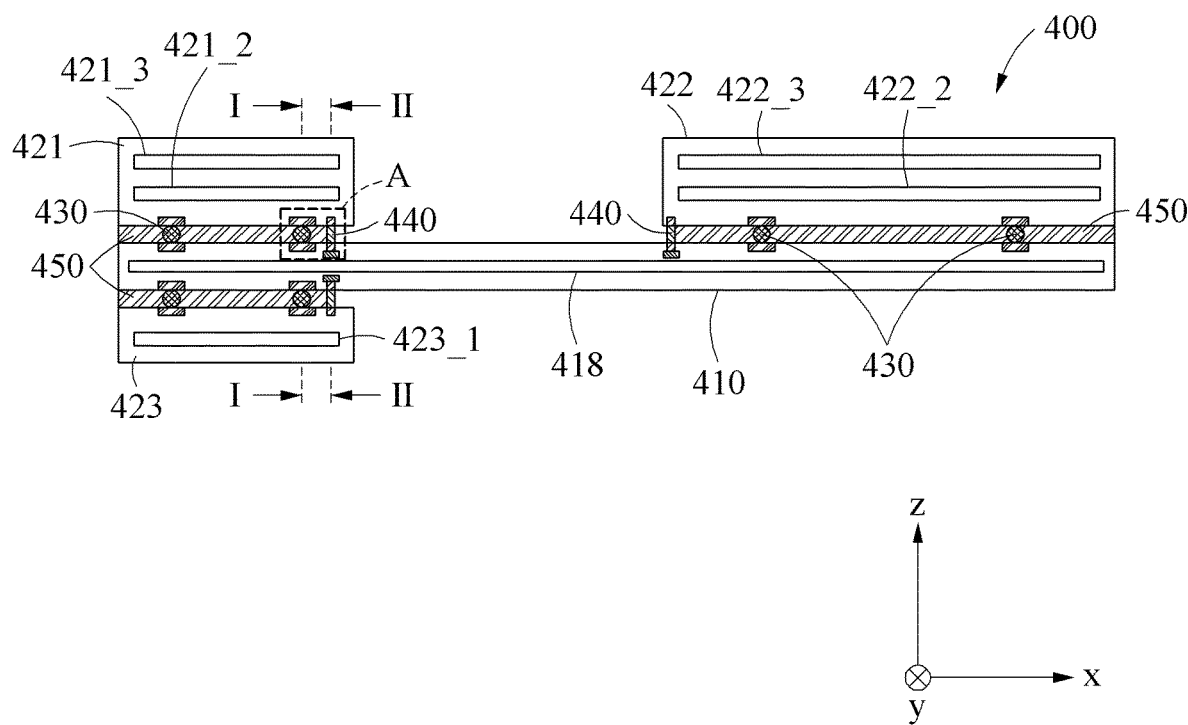
FIG. 4B is a side view schematically illustrating an electronic device according to an example embodiment.
Figure 4C:
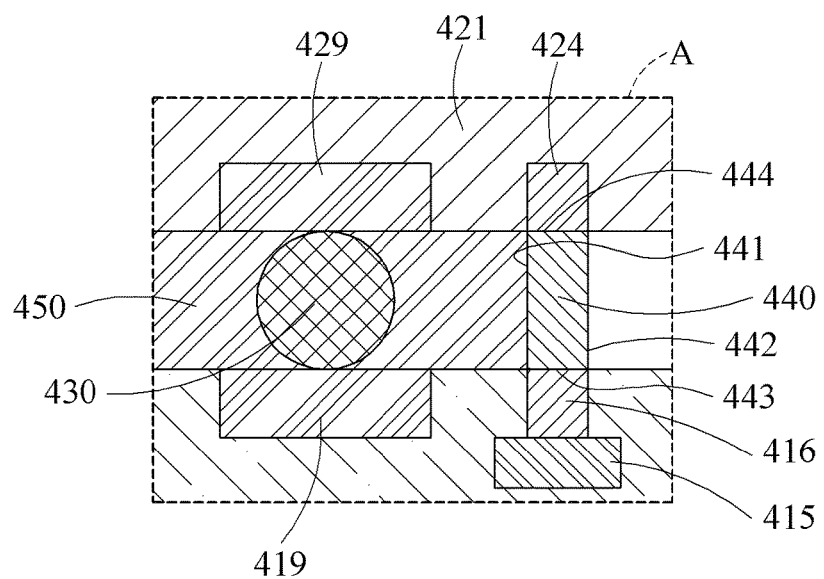
FIG. 4C is an enlarged view of a portion A of FIG. 4B.
Figure 4D:
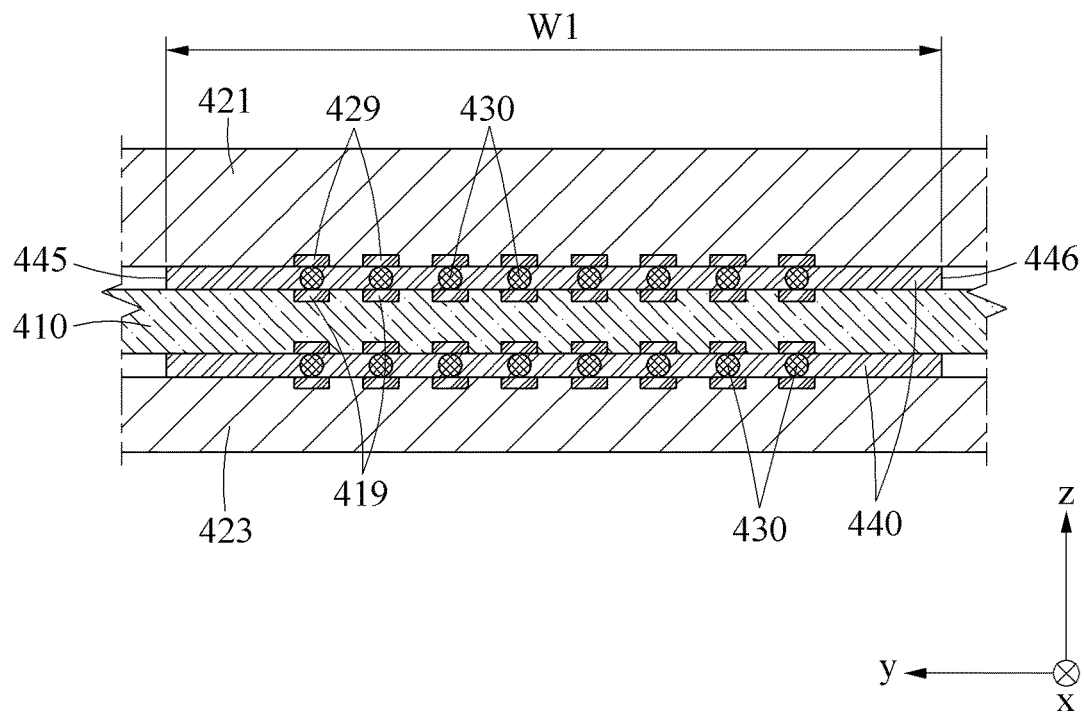
FIG. 4D is a cross-sectional view that is viewed from a line I-I of FIG. 4B.
Figure 4E:
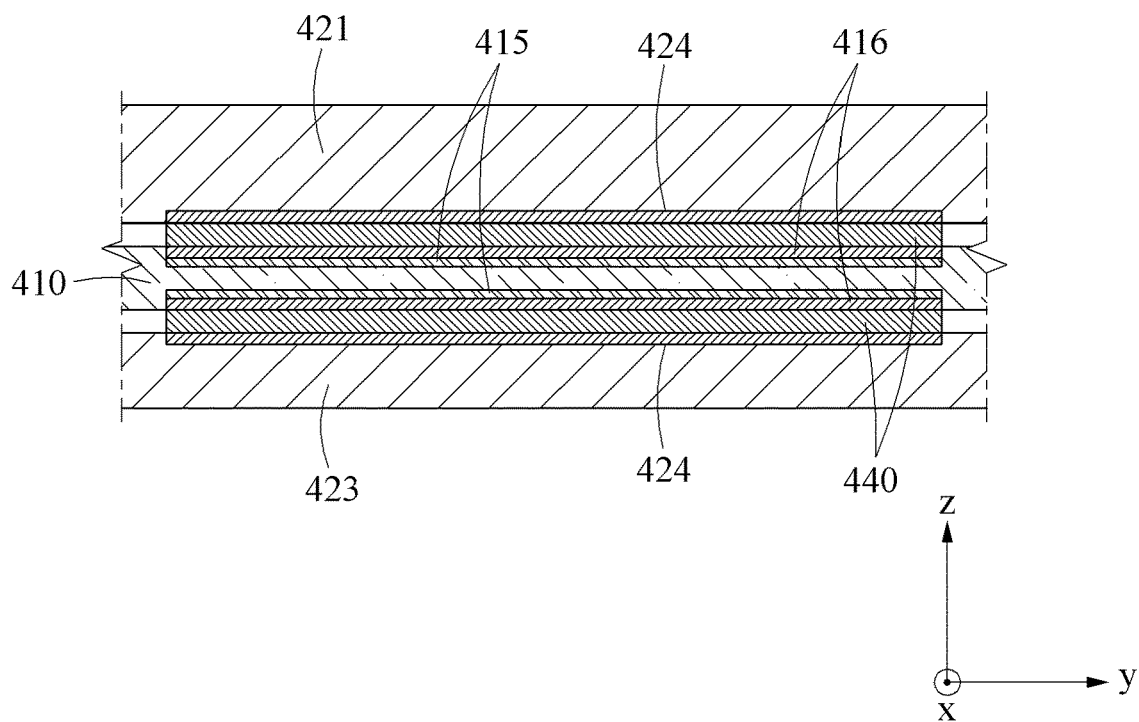
FIG. 4E is a cross-sectional view that is viewed from a line II-II of FIG. 4B.

FIG. 4A is a plan view schematically illustrating an electronic device according to an embodiment, FIG. 4B is a side view schematically illustrating the electronic device according to an embodiment, FIG. 4C is an enlarged view of a portion A of FIG. 4B, FIG. 4D is a cross-sectional view that is viewed from a line I-I of FIG. 4B, and FIG. 4E is a cross-sectional view that is viewed from a line II-II of FIG. 4B.

Referring to FIGS. 4A to 4E, an electronic device 400 may include an FPCB 410, a first antenna module 421, a second antenna module 422, a communication module 423, a solder ball 430, a solder wall 440, and an underfill resin 450.

According to various embodiments, the FPCB 410 may include a transmission line (e.g., an RF line) 418 therein. The transmission line 418 may be physically and electrically connected to a ball pad 419 supporting the solder ball 430 provided in a first support area of the FPCB 410. The transmission line 418 may be electrically connected to a plurality of array antennas 421_2 and 421_3 provided in the first antenna module 421. The transmission line 418 may be electrically connected to a plurality of array antennas 422_2 and 422_3 provided in the second antenna module 422, and the communication module 423.

According to various embodiments, the solder ball 430 may be surrounded by the underfill resin 450. Referring to FIGS. 4B and 4D, it is shown that solder balls 430 are provided in two parallel rows between the FPCB 410 and the first antenna module 421, and each row includes eight solder balls 430, such that a total of sixteen solder balls 430 are provided. However, the number and arrangement of solder balls are not limited thereto. Referring to FIGS. 4A and 4B, it is shown that four solder balls 430 are provided between the FPCB 410 and the second antenna module 422. However, the number and arrangement of solder balls are not limited thereto. The plurality of solder balls 430 may be disposed to be spaced apart from each other to prevent or reduce the chances of a short circuit.

According to various embodiments, the solder wall 440 may set a boundary of the underfill resin 450. For example, while the FPCB 410 and the first antenna module 421 are fixed by the solder ball 430 and the solder wall 440 as the reflow treatment of the solder ball 430 and the solder wall 440 is completed, the underfill resin 450 may be injected into the space between at least the FPCB 410 and the first antenna module 421. For example, the underfill resin 450 may be injected into the space between the FPCB 410 and the first antenna module 421, from a rear end portion of the FPCB (e.g., an end portion in the −x direction) toward a front side (e.g., the +x direction). The solder wall 440 may be provided on a moving path of the underfill resin 450 toward the front side to block the underfill resin 450 so that the underfill resin 450 may not reach a flexible area. Portions of the underfill resin 450 running out of the FPCB 410 may be cut.

According to various embodiments, the solder wall 440 may have an elongated shape. The solder wall 440 may be elongated in a direction intersecting with an imaginary line connecting the solder ball 430 and the flexible area 413. For example, the imaginary line connecting the solder ball 430 and the flexible area 413 may be parallel to the x-axis, and the solder wall 440 may be formed in a direction parallel to the y-axis. The solder wall 440 may block the underfill resin 450 from entering the flexible area 413.

According to various embodiments, the solder wall 440 may extend in a longitudinal direction (e.g., the +y/−y direction) between at least the solder ball 430 and the flexible area. The solder wall 440 may be elongated in a direction intersecting with the imaginary line connecting the solder ball 430 and the flexible area. For example, the imaginary line connecting the solder ball 430 and the flexible area may be parallel or approximately parallel to the x-axis, and the solder wall 440 may be elongated in a direction parallel to or approximately parallel to the y-axis. Here, the y-axis direction may also be referred to as a width direction of the FPCB.

According to various embodiments, an inner side surface 441 of the solder wall 440 may contact an inner side surface of the underfill resin 450 to block a flow of the underfill resin 450. An outer side surface 442 of the solder wall 440 may be spaced apart from the underfill resin 450 without contacting the underfill resin 450. A lower surface 443 of the solder wall 440 may be fixed in a state of contacting a base pad 416 provided in the FPCB 410, and an upper surface 444 of the solder wall 440 may be fixed in a state of contacting a cover pad 424 provided in a PCB of the first antenna module 421. The solder wall 440 may be connected to a ground plane 415 provided inside the FPCB 410 through the base pad 416.

According to various embodiments, a width W1 of the solder wall 440 may be greater than a width W2 of the flexible area 413 of the FPCB 410. Here, the width of the solder wall 440 may be the distance between a first end 445 and a second end 446, which are both ends of the solder wall 440, based on the width direction of the FPCB (the y-axis direction). Both ends (the first end 445 and the second end 446) of the solder wall 440 may be provided on an outer side of both ends of the flexible area 413, based on a width direction of the flexible area 413 (the y-axis direction), as shown in FIG. 4A for example.

A plurality of solder balls 430 may be provided. For example, as shown in the drawing, solder balls 430 may be provided in two rows, and each row may include eight solder balls. A width W3 of a row of solder balls 430 may be less than the width W1 of the solder wall 440.

For example, a width of the first support area connected to one side of the flexible area 413 (a length of the first support area in the y-axis direction) may be greater than the width of the flexible area 413, and a width of the second support area connected to the other side of the flexible area 413 (a length of the second support area in the y-axis direction) may be equal to the width of the flexible area 413. It is shown that the first support area is covered by the first antenna module 421 and the second support area is covered by the second antenna module 422. The width of the first support area may be equal to or approximately similar to a width of the first antenna module 421. The width of the second support area may be equal to or approximately similar to a width of the second antenna module 422. The first antenna module 421 having a width greater than the width of the flexible area 413 may be connected to the first support area, and the second antenna module 422 having a width equal to the width of the flexible area 413 may be connected to the second support area.

According to various embodiments, since sufficient space is secured between at least the first support area 411 and the first antenna module 421, a solder wall 440_1 provided between at least the first support area 411 of the FPCB 410 and the first antenna module 421 may be formed to have a width W1 greater than the width W2 of the flexible area 413. Since the width of the second support area 412 and the second antenna module 422 is equal to the width W2 of the flexible area 413, a solder wall 440_2 provided between at least the second support area 412 of the FPCB 410 and the second antenna module 422 may be formed to have a width substantially equal to the width W2 of the flexible area 413.

According to various embodiments, the FPCB 410 may include a solder resist layer (not shown) provided in an area excluding the base pad 416 and the ball pad 419. The solder resist layer may block a solder from being attached to the area in which the base pad 416 and the ball pad 419 are not provided.

According to various embodiments, the ball pad 419 provided in the FPCB 410 and a ball pad 429 provided in the first antenna module 421 or the second antenna module 422 may overlap each other based on a direction from the first antenna module 421 or the second antenna module 422 toward the FPCB 410 (e.g., the z-axis direction). The base pad 416 provided in the FPCB 410 and the cover pad 424 provided in the first antenna module 421 or the second antenna module 422 may overlap each other based on the direction from the first antenna module 421 or the second antenna module 422 toward the FPCB 410 (e.g., the z-axis direction). Each antenna module herein comprises at least one antenna.

Figure 5:
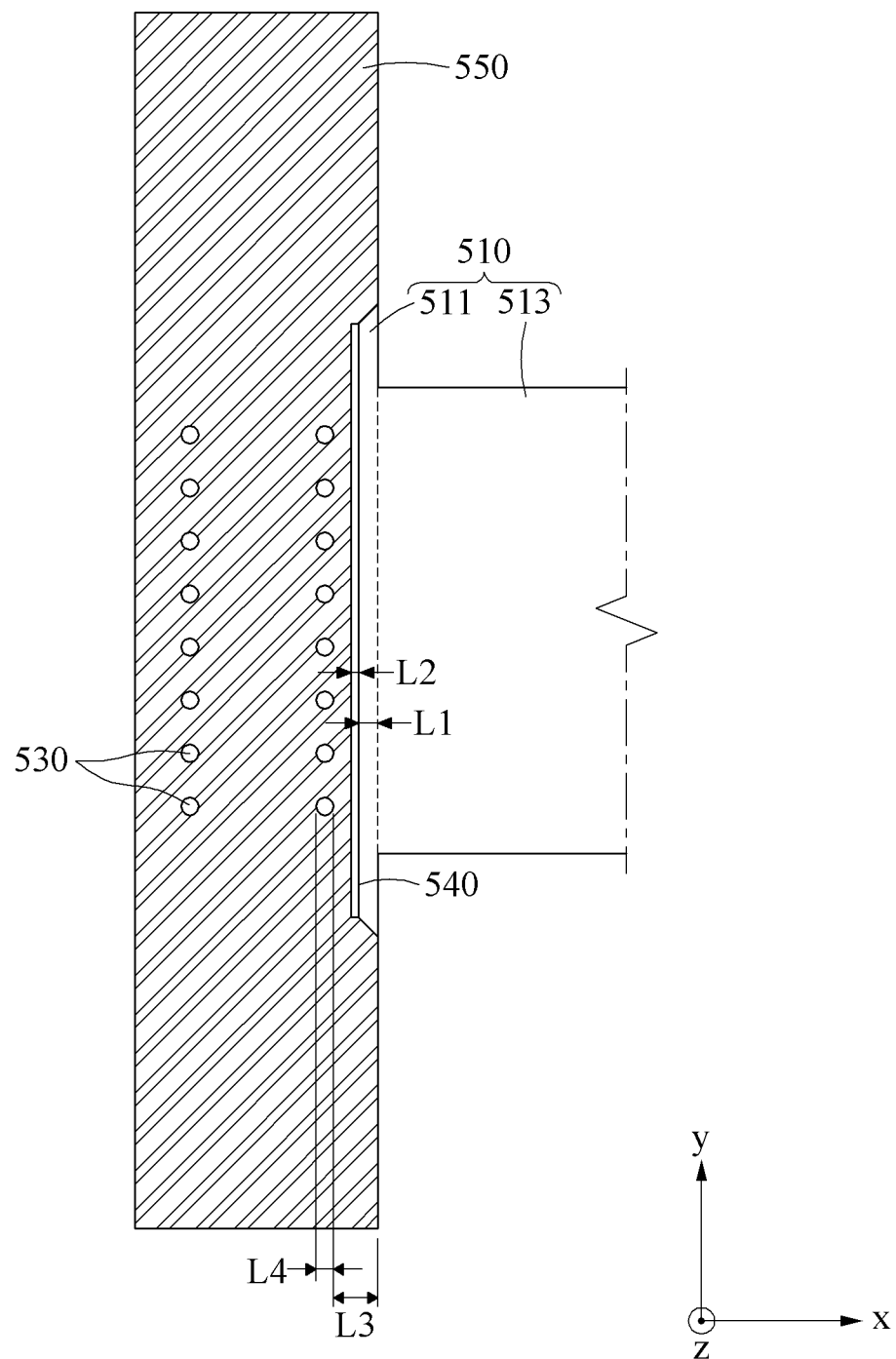
FIG. 5 is a plan view of an electronic device with a printed circuit board (PCB) omitted according to an example embodiment.

FIG. 5 is a plan view of an electronic device with an antenna module omitted according to an embodiment.

Referring to FIG. 5, an FPCB 510 may include a support area 511 and a flexible area 513, and an underfill resin 550 may be provided only in the support area 511, not reaching the flexible area 513 via a solder wall 540. The underfill resin 550 may enclose a plurality of solder balls 530.

According to various embodiments, the underfill resin 550 injected onto the FPCB 510 may flow in the x-axis direction, the y-axis direction, and the z-axis direction, but the solder wall 540 may set a range of flow of the underfill resin 550, disallowing the underfill resin 550 to pass through the solder wall 540 in the x-axis direction.

According to various embodiments, since the underfill resin 550 is not provided in the flexible area 513, the flexible area 513 may bend freely without the concentration of stress caused by the underfill resin 550. In addition, the flexible area 513 may maintain the bending shape without causing cracks within a housing (e.g., the housing 360 of FIG. 3).

According to various embodiments, a length L1 from a boundary between the support area 511 and the flexible area 513 to the solder wall 540 may range from 0.01 mm to 0.2 mm and may be, for example, 0.1 mm. A thickness L2 of the solder wall 540 may range from 0.01 mm to 0.3 mm and may be, for example, 0.15 mm. A length L3 from the boundary between the support area 511 and the flexible area 513 to the solder ball 530 may range from 0.01 mm to 0.7 mm and may be, for example, 0.35 mm. A thickness L4 of the solder ball 530 may range from 0.01 mm to 0.5 mm and may be, for example, 0.25 mm.

Figure 6:
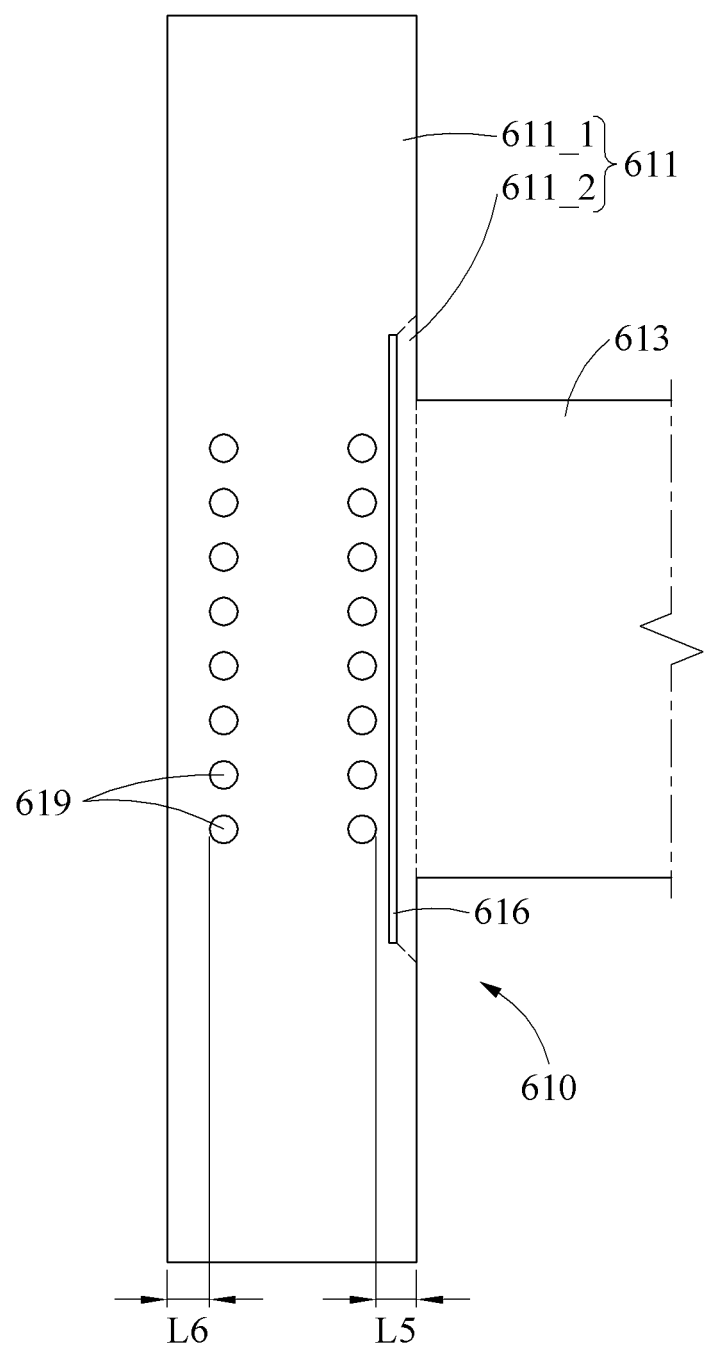
FIG. 6 is a plan view of a flexible printed circuit board (FPCB) according to an example embodiment.

FIG. 6 is a plan view of a flexible printed circuit board (FPCB) according to an embodiment.

Referring to FIG. 6, an FPCB 610 may include a support area 611 and a flexible area 613. The support area 611 may include a resin area 611_1 that is filled with an underfill resin 550 and comes into contact with the underfill resin 550, and a resin-free area 611_2 that is spaced apart from the underfill resin 550 and does not come into contact with the underfill resin 550.

According to various embodiments, in a state in which the underfill resin 550 is not injected, a ball pad 619 and a base pad 616 of the FPCB 610 may be exposed to the outside.

According to various embodiments, the resin-free area 611_2 may at least partially touch the flexible area 613. The resin-free area 611_2 may be positioned between at least the base pad 616 and the flexible area 613. The area of the resin-free area 611_2 may be determined according to a flow rate and/or physical property of the underfill resin 550 being injected.

According to various embodiments, a length L5 from a boundary between the support area 611 and the flexible area 613 to the ball pad 619 may range from 0.01 mm to 0.56 mm and may be, for example, 0.28 mm. A length L6 from a rear edge of the support area 511 to an adjacent ball pad 619 may range from 0.01 mm to 0.56 mm and may be, for example, 0.28 mm.

Figure 7:
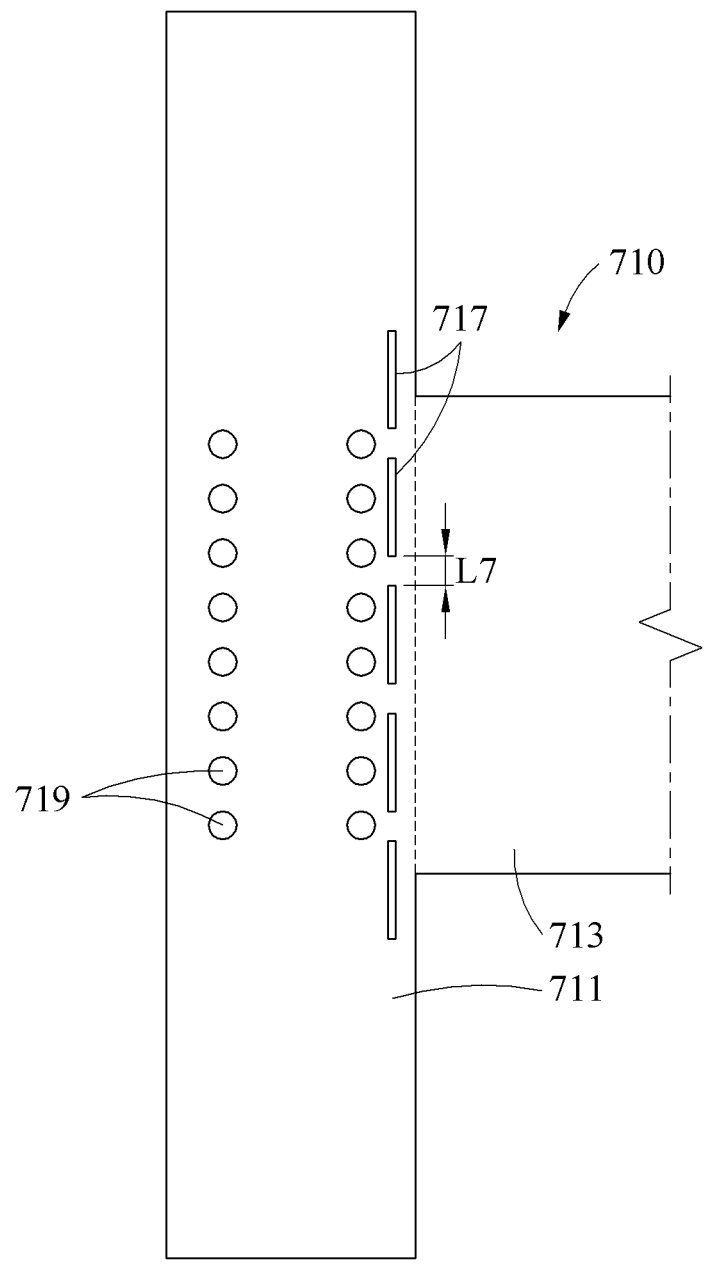
FIG. 7 is a plan view of an FPCB according to an example embodiment.

FIG. 7 is a plan view of an FPCB according to an embodiment.

Referring to FIG. 7, an FPCB 710 may include a support area 711, a flexible area 713, a ball pad 719, and a base pad. The base pad may include a plurality of sub-base pads 717. The sub-base pads 717 may be provided in a row and disposed to be spaced apart from each other.

According to various embodiments, a solder resist layer may be provided in an area between two adjacent sub-base pads 717 of the plurality of sub-base pads 717. During a reflow treatment process, a solder placed on one sub-base pad 717 of the plurality of sub-base pads 717 and a solder placed on another sub-base pad 717 may be connected to each other. Further, during the reflow treatment process, an area between two adjacent sub-base pads 717 may be filled with a solder paste.

According to various embodiments, the plurality of sub-base pads 717 may have various shapes. For example, the sub-base pads 717 may have a rectangular shape as shown, or may have another polygonal, circular, or elliptical shape.

According to various embodiments, a length L7 of a space between two adjacent sub-base pads 717 of the plurality of sub-base pads 717 may range from 0.01 mm to 0.3 mm and may be, for example, 0.15 mm.

Figure 8:
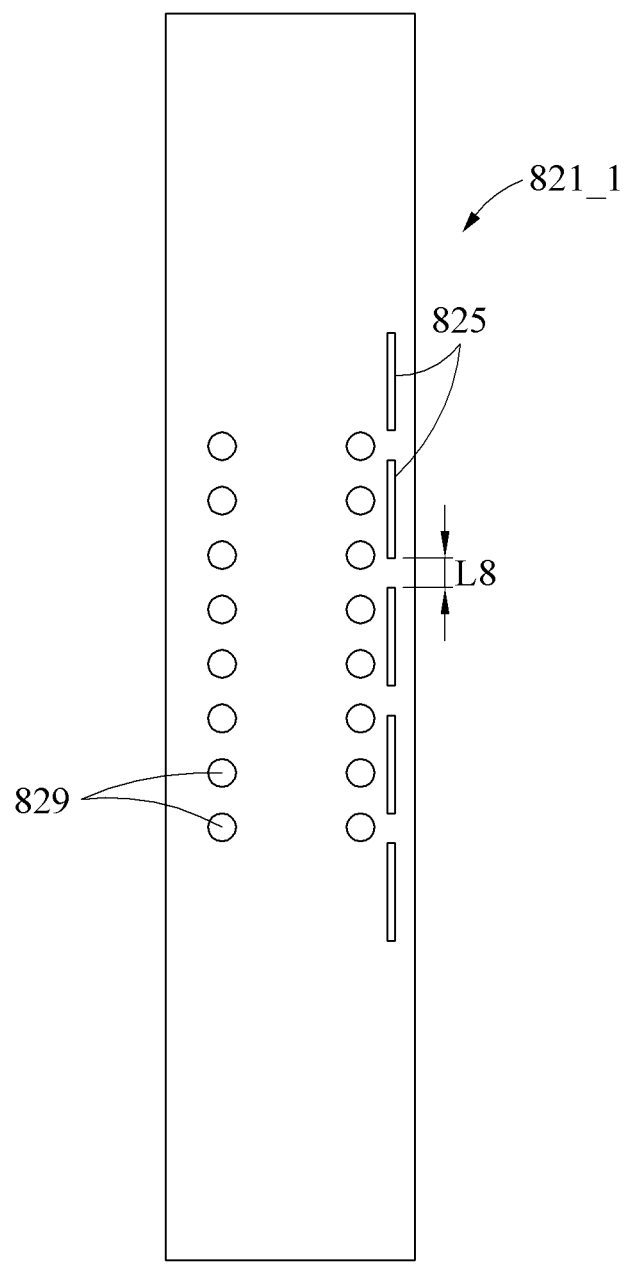
FIG. 8 is a plan view of a first PCB according to an example embodiment.

FIG. 8 is a plan view of a PCB according to an embodiment.

Referring to FIG. 8, a PCB 821_1 may include a ball pad 829 and a cover pad. The cover pad may include a plurality of sub-cover pads 825. The sub-cover pads 825 may be provided in a row and disposed to be spaced apart from each other.

According to various embodiments, a solder resist layer may be provided in an area between two adjacent sub-cover pads 825 of the plurality of sub-cover pads 825. During a reflow treatment process, a solder placed on one sub-cover pad 825 of the plurality of sub-cover pads 825 and a solder placed on another sub-cover pad 825 may be connected to each other and form a solder wall. For example, during the reflow treatment process, an area between two adjacent sub-cover pads 825 may be filled with a solder paste.

According to various embodiments, the plurality of sub-cover pads 825 may have various shapes. For example, the sub-cover pads 825 may have a rectangular shape as shown, or may have another polygonal, circular, or elliptical shape.

According to various embodiments, a length L8 of a space between two adjacent sub-cover pads 825 of the plurality of sub-cover pads 825 may range from 0.01 mm to 0.3 mm and may be, for example, 0.15 mm.

Figure 9:
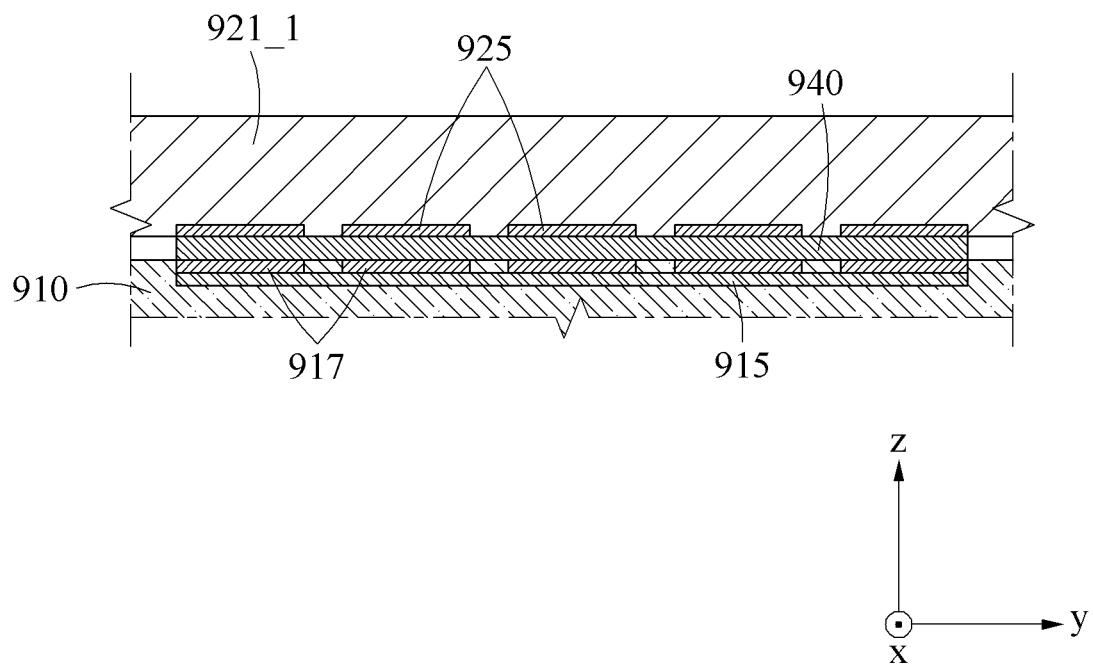
FIG. 9 is a cross-sectional view of an electronic device, illustrating a PCB connected to an FPCB according to an example embodiment.

FIG. 9 is a cross-sectional view of an electronic device, illustrating a PCB connected to an FPCB according to an embodiment.

Referring to FIG. 9, a solder wall 940 may be provided between an FPCB 910 and a PCB 921_1 of an antenna module facing the FPCB 910. The solder wall 940 may be fixed to a plurality of sub-base pads 917 provided in the FPCB 910 and to a plurality of sub-cover pads 925 provided in the PCB 921_1.

According to various embodiments, even when one sub-base pad 917 of the plurality of sub-base pads 917 is separated from the FPCB 910 due to an external shock applied to an electronic device, the sequential separation of the remaining sub-base pads 917 from the FPCB 910 by the separated sub-base pad 917 may be prevented or reduced. For example, when an external force that deforms a +y-directional end portion of the FPCB 910 in the −z direction acts, a sub-base pad 917 provided at the +y-directional end portion among the plurality of sub-base pads 917 may be separated from the FPCB 910. Even in this case, another sub-base pad 917 adjacent to the sub-base pad 917 provided at the +y-directional end portion may be maintained to be fixed to the FPCB 910. This structure may increase the durability of the electronic device and facilitate maintenance.

According to various embodiments, even when one sub-cover pad 925 of the plurality of sub-cover pads 925 is separated from the FPCB 910 due to an external shock applied to the electronic device, the sequential separation of the remaining sub-cover pads 925 from the FPCB 910 by the separated sub-cover pad 925 may be prevented or reduced.

According to various embodiments, based on a height direction of the solder wall 940 (e.g., the z-axis direction), one sub-base pad 917 among the plurality of sub-base pads 917 may overlap one sub-cover pad 925 among the plurality of sub-cover pads 925.

Figure 10:
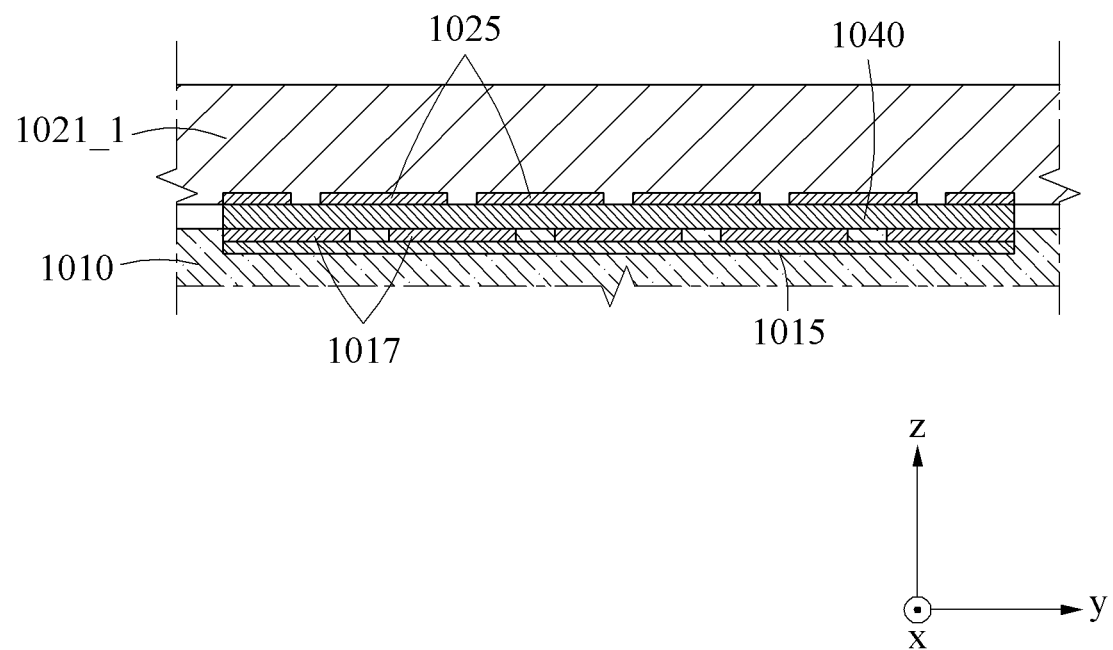
FIG. 10 is a cross-sectional view of an electronic device, illustrating a PCB connected to an FPCB according to an example embodiment.

FIG. 10 is a cross-sectional view of an electronic device, illustrating a PCB connected to an FPCB according to an embodiment.

Referring to FIG. 10, a solder wall 1040 may be provided between an FPCB 1010 and a PCB 1021_1 of an antenna module facing the FPCB 1010. The solder wall 1040 may be fixed to a plurality of sub-base pads 1017 provided in the FPCB 1010 and to a plurality of sub-cover pads 1025 provided in the PCB 1021_1.

According to various embodiments, based on a height direction of the solder wall 1040 (e.g., the z-axis direction), one sub-base pad 1017 among the plurality of sub-base pads 1017 may overlap two or more sub-cover pads 1025 among the plurality of sub-cover pads 1025. This structure may increase the mechanical coupling force between the FPCB 1010 and the PCB 1021_1 and the solder wall 1040.

Figure 11:
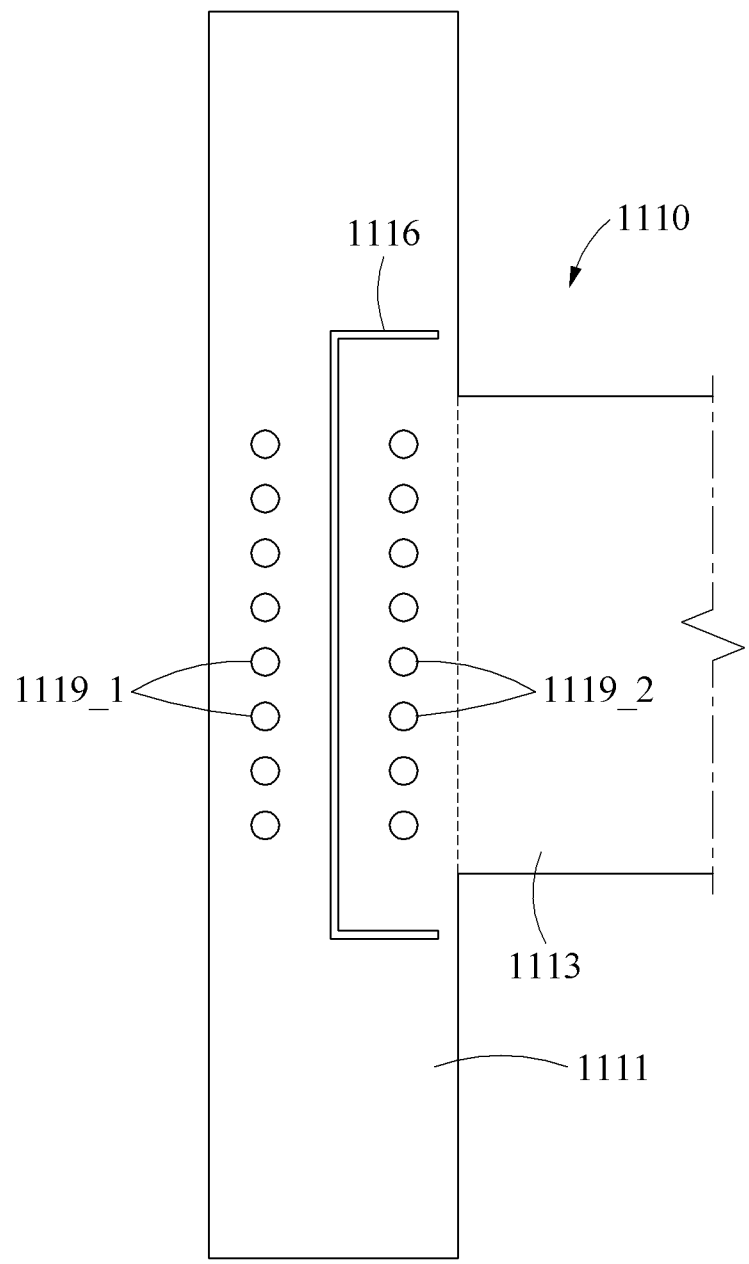
FIG. 11 is a plan view of an FPCB according to an example embodiment.

FIG. 11 is a plan view of an FPCB according to an embodiment.

Referring to FIG. 11, an FPCB 1110 may include a support area 1111, a flexible area 1113, a base pad 1116, and a plurality of ball pads 1119_1 and 1119_2.

According to various embodiments, the base pad 1116 may be provided in an approximately "flattened U" shape. The plurality of ball pads 1119_1 and 1119_2 may include first ball pads 1119_1 and second ball pads 1119_2 that are provided on opposite sides based on the base pad 1116. According to this structure, an area in which the first ball pads 1119_1 are provided may be filled with an underfill resin (not shown), and an area in which the second ball pads 1119_2 are provided may not be filled with the underfill resin.

According to various embodiments, an electronic device 300 may include: an FPCB 310 having a flexible area 313 and a support area 311 and configured to be deformable in the flexible area 313; an antenna module 321 facing the support area 311 of the FPCB 310; a solder ball 330 for connecting, directly or indirectly, the FPCB 310 and the antenna module 321: an underfill resin 350 filled between the FPCB 310 and the antenna module 321 in a liquid state and then solidified; and a solder wall 340 for connecting, directly or indirectly, the FPCB 310 and the antenna module 321 and positioned between the solder ball 330 and the flexible area 313 to block a flow of the underfill resin 350 from the support area 311 toward the flexible area 313 before the underfill resin 350 is solidified, the solder wall 340 having a width equal to or greater than a width of the flexible area 313.

According to various embodiments, both ends 445 and 446 of the solder wall 440 may be provided on an outer side than both ends of the flexible area 413, based on a width direction of the flexible area (the y-axis direction).

According to various embodiments, the solder wall 440 may include: an inner side surface 441 that faces the solder ball 430 side and contacts the underfill resin 450; and an outer side surface 442 that is provided on an opposite side of the inner side surface 441, faces the flexible area 413 side, and does not contact the underfill resin 450.

According to various embodiments, the support area 311 may be fixed to the antenna module 321 by the solder ball 430, the solder wall 340, and the underfill resin 350 and maintain the shape, and the flexible area 312 may be deformable.

According to various embodiments, the solder wall 440 may be elongated in a direction (e.g., the y-axis direction) intersecting with an imaginary line connecting the solder ball 430 and the flexible area 413 (e.g., a line parallel with the x-axis).

According to various embodiments, the solder ball 430 and the solder wall 440 may be formed of the same material.

According to various embodiments, the FPCB 410 may include a ground plane 415, and a base pad 416 connected to the ground plane 415 and the solder wall 440, and the antenna module 421 may include a cover pad 424 that faces the base pad 416 and is connected to the solder wall 440.

According to various embodiments, a width of the base pad 416 may be equal to or greater than a width of the flexible area 413 of the FPCB 410.

According to various embodiments, one or more of the base pad and the cover pad may include a plurality of sub-pads 717 or 825 provided in a row and disposed to be spaced apart from each other.

According to various embodiments, the base pad may include a plurality of sub-base pads 1017, and the cover pad may include a plurality of sub-cover pads 1025, wherein one sub-base pad 1017 of the plurality of sub-base pads 1017 may overlap two or more sub-cover pads of the plurality of sub-cover pads 1025, based on a height direction of the solder wall.

According to various embodiments, the solder wall 940 may contact an area between two adjacent sub-pads among the plurality of sub-pads 917 and 925.

According to various embodiments, the support area 611 may include a resin area 611_1 filled with the underfill resin, and a resin-free area 611_2 that touches the flexible area and is spaced apart from the underfill resin.

According to various embodiments, the resin-free area 611_2 may be positioned between the base pad 615 and the flexible area 613.

According to various embodiments, an electronic device 300 may include: an FPCB 310 having a flexible area 313 and a support area 311 and configured to be deformable in the flexible area 313: an antenna module 321 facing the support area 311 of the FPCB 310; a solder ball 330 for connecting, directly or indirectly, the FPCB 310 and the antenna module 321: an underfill resin 350 filled between the FPCB 310 and the antenna module 321; and a solder wall 340 for connecting, directly or indirectly, the FPCB 310 and the antenna module 321 and positioned between the solder ball 330 and the flexible area 313, wherein both ends of the solder wall 340 may be provided on an outer side than both ends of the flexible area 313, based on a width direction of the flexible area.

According to various embodiments, an electronic device 300 may include: a housing 360; an FPCB 310 including a support area 311 provided in a flat state, and a flexible area 313 connected to the support area and provided in a bending state, the FPCB 310 positioned in the housing 360; an antenna module 321 facing the support area 311 of the FPCB 310; a solder ball 330 for connecting, directly or indirectly, the FPCB 310 and the antenna module 321: an underfill resin 350 filled between the FPCB 310 and the antenna module 321 in a liquid state and then solidified; and a solder wall 340 for connecting, directly or indirectly, the FPCB 310 and the antenna module 321 and configured to block a flow of the underfill resin 350 from the support area 311 toward the flexible area 313 before the underfill resin 350 is solidified, the solder wall 340 having a width equal to or greater than a width of the flexible area 313 of the FPCB 310.

According to various embodiments, the flexible area 313 may include a portion bending at an angle between 45 degrees and 180 degrees.

According to various embodiments, the support area 311, 312 may include a first support area 311 and a second support area 312 provided on opposite sides based on the flexible area 313, and the antenna module 321, 322 may include a first antenna module 321 connected to the first support area 311 and a second antenna module 322 connected to the second support area 312.

According to various embodiments, the first support area 311 and the second support area 312 may be provided in intersecting directions within the housing 360.

According to various embodiments, the support area 611 may include a resin area 611_1 filled with the underfill resin, and a resin-free area 611_2 that touches the flexible area 613 and is spaced apart from the underfill resin.

According to various embodiments, the solder wall 440 may be elongated in a direction intersecting with an imaginary line connecting the solder ball 430 and the flexible area 413.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device, comprising:
a flexible printed circuit board (FPCB) comprising a flexible area and a support area, where the FPCB is configured to be deformable in the flexible area;
an antenna module, comprising an antenna, facing the support area of the FPCB;
a solder ball for connecting the FPCB and the antenna module;
an underfill resin filled between at least the FPCB and the antenna module in a liquid state and then solidified; and
a solder wall for connecting the FPCB and the antenna module and positioned between at least the solder ball and the flexible area to block a flow of the underfill resin from the support area toward the flexible area before the underfill resin is solidified, the solder wall comprising a width at least as great as a width of the flexible area.

2. The electronic device of claim 1, wherein
both ends of the solder wall are provided on an outer side of both ends of the flexible area.

3. The electronic device of claim 1, wherein
the solder wall comprises:
an inner side surface that faces the solder ball side and physically contacts the underfill resin; and
an outer side surface that is provided on an opposite side of the inner side surface, faces the flexible area side, and does not physically contact the underfill resin.

4. The electronic device of claim 1, wherein
the support area is fixed to the antenna module by the solder ball, the solder wall, and the underfill resin and maintains the shape, and wherein the flexible area is deformable.

5. The electronic device of claim 1, wherein
the solder wall is elongated in a direction intersecting with an imaginary line connecting the solder ball and the flexible area.

6. The electronic device of claim 1, wherein
the solder ball and the solder wall are formed of the same material.

7. The electronic device of claim 1, wherein
the FPCB comprises a ground plane, and a base pad connected to the ground plane and the solder wall, and
the antenna module comprises a cover pad that faces the base pad and is connected to the solder wall.

8. The electronic device of claim 7, wherein
a width of the base pad is at least as great as a width of the flexible area of the FPCB.

9. The electronic device of claim 7, wherein
at least one of the base pad and the cover pad comprise a plurality of sub-pads provided in a row and spaced apart from each other.

10. The electronic device of claim 9, wherein
the base pad comprises a plurality of sub-base pads, and the cover pad comprises a plurality of sub-cover pads,
wherein one sub-base pad of the plurality of sub-base pads overlaps at least two sub-cover pads of the plurality of sub-cover pads.

11. The electronic device of claim 9, wherein
the solder wall contacts an area between two adjacent sub-pads among the plurality of sub-pads.

12. The electronic device of claim 7, wherein
the support area comprises a resin area filled with the underfill resin, and a resin-free area that touches the flexible area and is spaced apart from the underfill resin.

13. The electronic device of claim 12, wherein
the resin-free area is positioned between at least the base pad and the flexible area.

14. The electronic device of claim 1, wherein
the solder wall comprises:
an inner side surface that faces the solder ball side and physically contacts the underfill resin; and
an outer side surface that is provided on an opposite side of the inner side surface, faces the flexible area side, and does not physically contact the underfill resin,
wherein both ends of the solder wall are provided on an outer side of both ends of the flexible area.

15. The electronic device of claim 1, wherein
the solder wall is configured to block a flow of the underfill resin from the support area toward the flexible area before the underfill resin is solidified and has a width at least as great as a width of the flexible area of the FPCB.

16. A method of making an electronic device, comprising a flexible printed circuit board (FPCB) comprising a flexible area and a support area, where the FPCB is configured to be deformable in the flexible area: an antenna module, comprising an antenna, facing the support area of the FPCB: a solder ball for connecting the FPCB and the antenna module: a solder wall; and an underfill resin; the method comprising:
  providing the underfill resin between at least the FPCB and the antenna module in a liquid state and then solidifying the underfill resin; and
  wherein the solder wall, for connecting the FPCB and the antenna module, is positioned between at least the solder ball and the flexible area to block a flow of the underfill resin from the support area toward the flexible area before the underfill resin is solidified, the solder wall comprising a width at least as great as a width of the flexible area.

17. The method of claim 16, wherein
the solder wall comprises:
an inner side surface that faces the solder ball side and physically contacts the underfill resin; and
an outer side surface that is provided on an opposite side of the inner side surface, faces the flexible area side, and does not physically contact the underfill resin.

18. The method of claim 16, wherein
the support area is fixed to the antenna module by the solder ball, the solder wall, and the underfill resin and maintains the shape, and wherein the flexible area is deformable.

* * * * *